United States Patent [19]

Reed et al.

[11] 4,311,017
[45] Jan. 19, 1982

[54] THERMOELECTRIC JUG COOLER

[75] Inventors: Kingstone L. H. Reed; William Danchuk; Ian Hatcher, all of Barrie, Canada

[73] Assignee: Koolatron Industries, Inc., Barrie, Canada

[21] Appl. No.: 134,172

[22] Filed: Mar. 26, 1980

[51] Int. Cl.³ .......................... F25B 21/02; F25D 3/08
[52] U.S. Cl. ............................................. 62/3; 62/457
[58] Field of Search ...................................... 62/3, 457

[56] References Cited

U.S. PATENT DOCUMENTS

| | | | |
|---|---|---|---|
| 2,991,628 | 7/1961 | Tuck | 62/3 |
| 3,149,471 | 9/1964 | Boehmer et al. | 62/3 |
| 3,243,965 | 4/1966 | Jepson | 62/3 |
| 3,250,433 | 5/1966 | Christine et al. | 62/3 X |
| 3,310,953 | 3/1967 | Rait | 62/3 |
| 3,314,242 | 4/1967 | Lefferts | 62/3 |
| 3,351,233 | 11/1967 | Chanoch et al. | 62/3 X |
| 3,712,072 | 1/1973 | Hoge et al. | 62/3 |
| 3,713,302 | 1/1973 | Reuiel | 62/3 |
| 3,733,836 | 5/1973 | Corini | 62/3 |
| 3,808,825 | 5/1974 | Ciurea | 62/3 |

Primary Examiner—Lloyd L. King
Attorney, Agent, or Firm—Cahill, Sutton & Thomas

[57] ABSTRACT

A thermoelectric cooler includes a base unit having an internal heat exchanger located on the upper surface of the base unit and an external heat exchanger disposed in a duct which is located in lower compartment of the base unit. A thermoelectric module transfers heat from the internal heat exchanger to the external heat exchanger. A fan located in the duct blows outside air through the fins of the external heat exchanger. The internal heat exchanger supports a pair of vessels containing liquid to be cooled. An insulated cover unit has a lower peripheral edge which contacts the peripheral lip of the base unit to completely seal the compartment in which the jugs are contained. Each vessel has a spigot which extends through a respective opening in the base unit from the lower portion of that vessel. A pair of stirring mechanisms extend through the top of the cover unit through the lids of the respective vessels to permit stirring of the fluid.

15 Claims, 7 Drawing Figures

THERMOELECTRIC JUG COOLER

BACKGROUND OF THE INVENTION

1. Field of the Invention

The invention relates to thermoelectric cooling devices and, more particularly, to thermoelectric coolers for liquid containing vessels.

2. Description of the Prior Art

A variety of portable coolers for liquid containing vessels or jugs have been proposed. Some of the devices have been exceedingly expensive, heavy, and awkward due to expensive compressor units of the refrigeration systems utilized therein. A variety of liquid heating and/or cooling devices for specialized purposes have also been proposed. The state of the art for specialized thermoelectric liquid cooling devices is indicated in U.S. Pat. Nos. 3,808,825, 2,991,628, 3,712,072, 3,314,242, 3,398,337, 3,713,302 and 3,243,965. U.S. Pat. No. 3,310,953 discloses a portable thermoelectric refrigerator for beverage containers. That device includes a unitary structure having side walls which define an upper compartment which closely surrounds a beverage container and a lower compartment which contains an external heat exchanger, a fan and fan motor, and a thermoelectric module. A transverse wall dividing the two compartments incorporates a second heat exchanger, the upper surface of which directly contacts the bottom of the beverage container in the open top upper compartment. A vessel having an insulating lid and a dispenser having a draw tube extending through a hole in the insulating top to the bottom of the beverage container is provided. The device disclosed in U.S. Pat. No. 3,310,953 has numerous disadvantages. The open top upper compartment in which the beverage container is contained requires an insulating top which is unlikely to efficiently prevent loss of heat through the gap between the insulating side walls of the upper compartment and the beverage container top. A dispenser having a pump incorporated therein is utilized to draw beverage out of the beverage container. The pump must be manually activated to dispense the beverage. Extended portions of the external heat sink in the lower compartment from supporting legs for the entire thermoelectric refrigerator, and the outer walls of the lower compartment are substantially spaced from the sides of the external heat exchanger. Consequently, only a portion of the air moved by the electric fan moves through the fins of the external heat exchanger. The remaining portion of the air moved by the fan passes through the open space between the walls of the lower compartment and the heat exchanger. This results in inefficient cooling and excessive power consumption by the fan motor. The heat exchanger disposed on the opposite side of the thermoelectric module contacts only a portion of the bottom of the beverage container, resulting in inefficient transfer of heat from the beverage container to the external heat sink via the thermoelectric module. The external heat sink or exchanger is excessively large and unduly expensive.

Accordingly, it is an object of the invention to provide a portable, low-cost jug cooler which very efficiently insulates jugs or liquid containing vessels from loss of heat.

Another object of the invention is to provide a thermoelectric jug or vessel cooler which minimizes power consumption by an electric power source providing power to a fan motor and a thermoelectric module.

A further object of the invention is to provide a thermoelectric jug cooler which efficiently moves ambient air through the fins of a heat exchanger.

A still further object of the invention is to provide a thermoelectric jug cooler which provides efficient dispensing of liquid from a container without the necessity for actuating a pump.

A yet further object of the invention is to provide a thermoelectric jug or liquid vessel cooler which overcomes the shortcomings of the above prior art.

A further object of the invention is to provide a thermoelectric cooler which efficiently operates with an inexpensive, minimum sized external heat exchanger.

SUMMARY OF THE INVENTION

Briefly described, and in accordance with one embodiment thereof, the invention provides a thermoelectric apparatus for changing the temperature of a quantity of liquid from a first temperature to a second temperature. In the described embodiment of the invention, the thermoelectric apparatus is a cooler including a base unit which supports a thermally conductive plate. The bottoms of a pair of liquid containers rest on and are in intimate thermal contact with the thermally conductive plate. A thermoelectric module is disposed between the cold plate and a heat exchanger. The heat exchanger is disposed within a narrowed portion of a duct. The duct extends between an air inlet opening and an air outlet opening disposed on opposite sides of the base unit. An electric fan disposed in the duct draws air into the air inlet opening and forces substantially all of that air through the regions between various parallel fins of the heat exchanger. An insulated cover extends over the top of the liquid containers and surrounds the sides of the containers. Each container includes a spigot extending from a lower portion of that container through a sidewall of the thermoelectric apparatus to allow dispensing of liquid from the liquid containers without removal of the insulated cover. In the described embodiment of the invention, lower surfaces of each of the spigots are disposed in close fitting slots in an upper edge of the base unit, which upper edge closely contacts the lower edge of the cover unit to thermally insulate the region in which the liquid containers are disposed. In the described embodiment of the invention, a mechanical stirrer extends from a location near the bottom of the interior of one of the liquid containers through a lid thereof and through an opening in the cover unit to effect stirring of liquid in the container.

DESCRIPTION OF THE INVENTION

Figure 1:
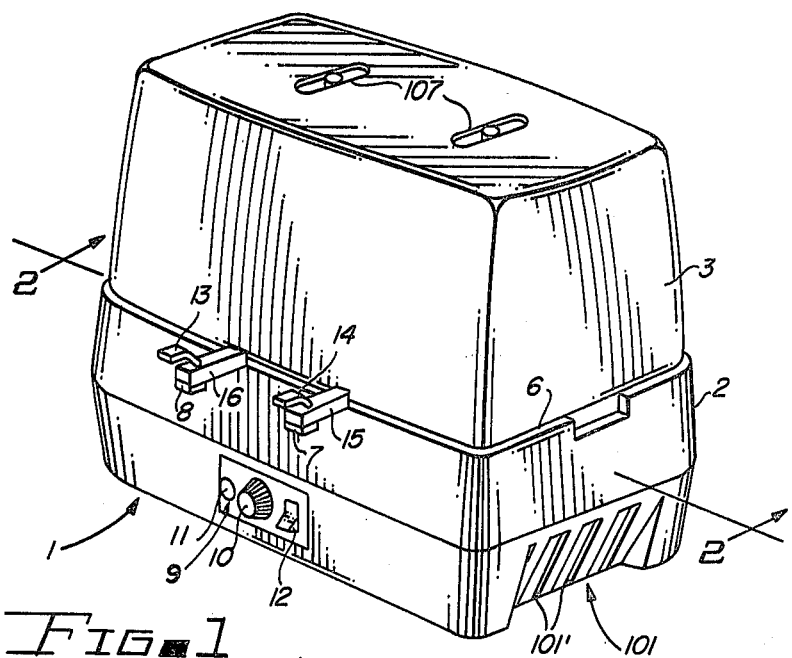
FIG. 1 is a perspective view of the jug cooler of the present invention.
Figure 2:
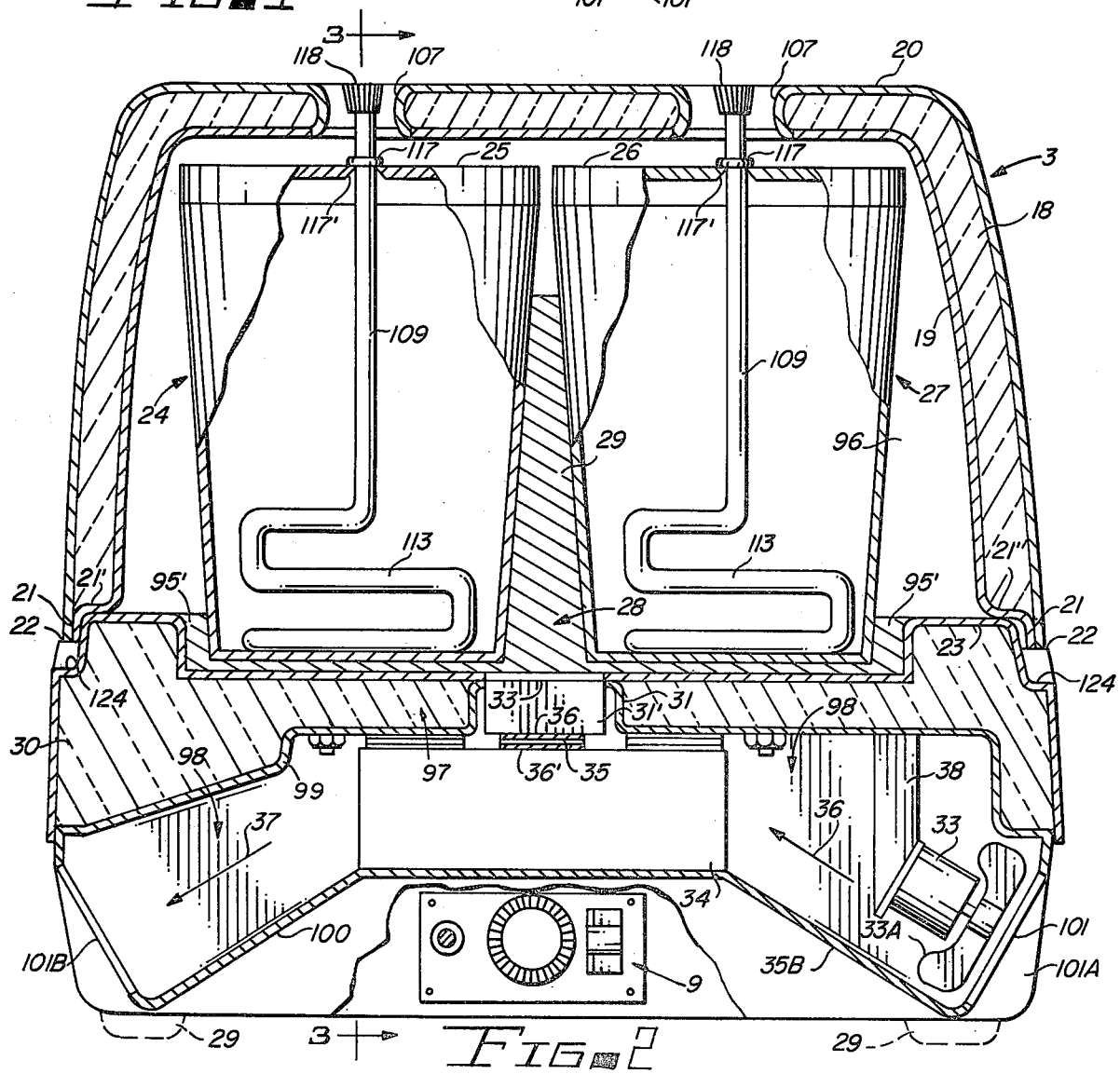
FIG. 2 is a partial sectional view taken along section lines 2—2 of FIG. 1.
Figure 3:
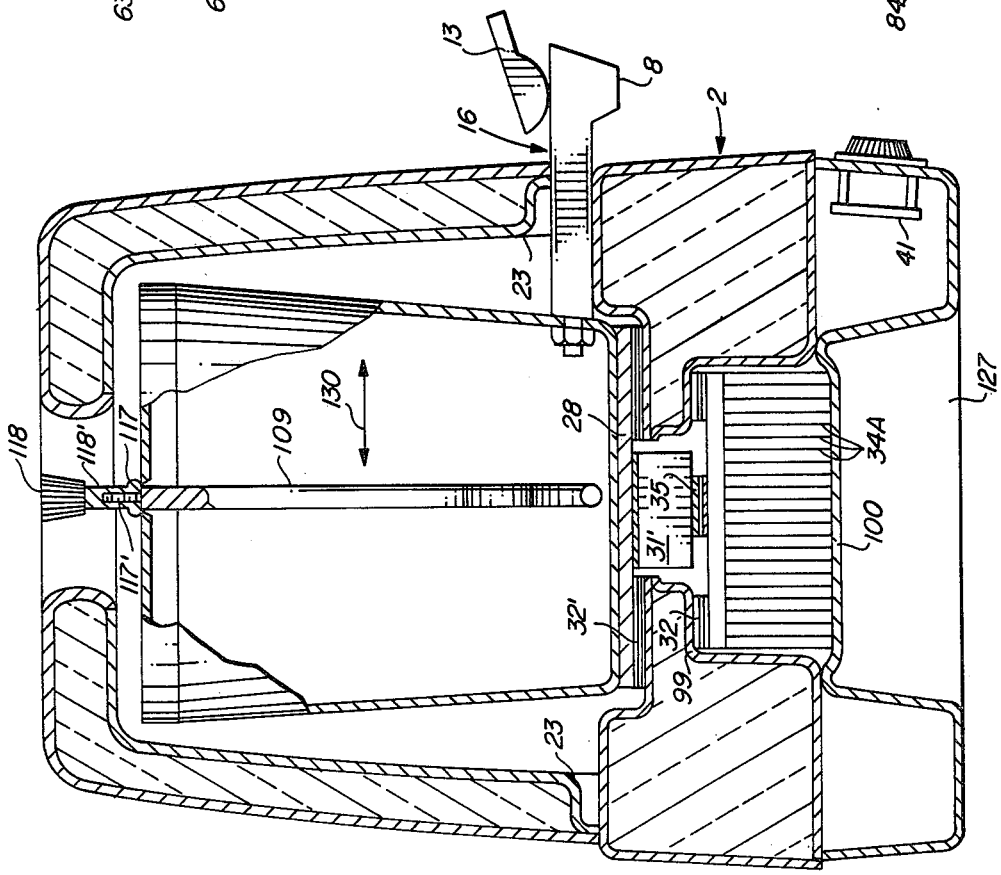
FIG. 3 is a partial sectional view taken along section line 3—3 of FIG. 2.

Referring now to FIGS. 1-3, thermoelectric jug cooler 1, hereinafter referred to as thermoelectric cooler 1, includes a base unit 2 and removable cover 3. Cover 3 can be lifted off of base unit 2 by insertion of a user's fingers in each of a pair of recesses 124 in base unit 2.

When cover 3 is removed from base unit 2, a pair of liquid containing jugs or vessels 24 and 27 are exposed. Each of vessels 24 and 27 is supported by thermally conductive support 28 which closely contacts the bottom of vessels 24 and 27. Thermally conductive support, which is composed of thermally conductive aluminum, includes a pair of bottom sections 95 which closely contact the bottom of vessels 24 and 27, which have square bottoms. Thermally conductive support 28 also includes vertical portion 29 which closely contacts the inner side walls of vessels 24 and 27. Flanges 95' hold vessels 25 and 27 against upper portion 29 of thermally conductive support 28, thereby minimizing thermal resistance between portion 28 and vessels 24 and 27. Vertical portion 29 produces a temperature gradient between the upper and lower outer portions of the liquids contained in vessels 24 and 27, thereby creating convection currents which result in a degree of mixing of the fluids and improved uniformity of the temperature thereof. The empty space in region 96 between the outer surfaces of vessels 24 and 27 and the inner surface of cover 3 increases the thermal resistance between vessels 24 and 27 and the ambient outside atmosphere.

Cover 3 includes a hard outer skin 20 and a hard inner skin 19, both of which can be composed of plastic such as high impact ABS plastic. An insulating material 18 is disposed between the hard surface material 19 and 20. Insulation 18 can be rigid urethane foam insulation material. The lower edge of cover 3 includes flat, smooth lower surface 21', and an adjacent outer lip or flange 21. Surface 21' rests on smooth, flat upper surface 23 of base unit 2, substantially sealing interior compartment 96 enclosed by cover 3 and base unit 2.

Base unit 2 has a hard outer surface of plastic such as high impact ABS plastic and has a plurality of inner surfaces also made of high impact ABS plastic. An insulated transverse wall 97 having an opening 31 therein separates upper compartment 96 from a lower compartment and a duct in which external heat sink 34 is disposed. Thermally conductive support is attached to thermally conductive extender block 31' which is also made of high thermal conductivity aluminum. Extender block 31' makes intimate thermal contact with cold plate 28 by means of a layer 33 of thermally conductive grease 33, which is known and readily available to those skilled in the art. A suitable rubber or foam gasket 32' (shown in FIG. 3) provides an airtight seal between the bottom of thermally conductive support 28 and the upper surface of transverse wall 97 to preventing heating of cold plate 28 due to leakage of heated air near external heat sink 34 into upper compartment 96. A thermoelectric module 35 (similar to that described in the copending U.S. patent application entitled "CONTROL CIRCUITRY FOR THERMOELECTRIC COOLER" by Michael A. Reed, Ser. No. 6/102,447, filed Dec. 11, 1979, and incorporated herein by reference) is disposed between the lower surface of extender block 31' and makes intimate contact therewith by means of a layer 36 of thermally conductive grease. Extender block 31' extends through opening 31 in transverse insulating wall 97 in order to contact both thermoelectric module 35 and cold plate 28.

A lower thermally insulating airtight gasket 32 is disposed between the upper surface of external heat sink 34 and the lower surface of transverse wall 97 to prevent leakage of cold air from around extender block 31' to duct 98. Duct 98 is bounded by lower surface 99 of transverse wall 97. The lower portion of duct 98 is bounded by lower plastic wall 100. Cold plate 28 is bolted to the bottom of transverse wall 97 by means of a pair of bolts which pass through transverse wall 97. A fan motor 33 having a rotary fan blade 33A connected thereto is mounted by means of bracket 38 to the lower surface 99 of transverse wall 97.

As shown in FIG. 1, the lower right end portion of base unit 2 includes a generally inwardly sloped lower portion 101 having a plurality of grill openings 101' therein. The opposite lower end (i.e., the left lower end) of base unit 2 also includes a similar lower sloped surface portion 101A having a plurality of grill openings therein. The grill openings (not shown) in sloped surface 101A on the left end of base unit 2 open into duct 98. Although the external pattern of grill openings 101' in lower right sloped surface 101 is not circular, the interior configuration of the grill openings extending completely through sloped wall 101 into duct 98 is of a circular configuration having a diameter approximately equal to the diameter of the path traced by rotating fan blade 33A. This prevents air drawn into duct 98 by fan blade 33A from leaking back out of the grill openings 101' due to increased air pressure in duct 98.

When fan 33A rotates, air is drawn into duct 98 in the direction indicated by arrow 36 in FIG. 2. This air is efficiently drawn into duct 98, the cross sectional area of which decreases with decreasing distance to the right hand edge of external heat exchanger 34. The decreasing cross sectional area allows the use of a smaller, less expensive external heat exchanger 34. The velocity of air moving in duct 98 increases as the air approaches heat exchanger 34, promoting efficient removal of heat from fins 34A by the moving air. It also provides a cavity 127 (FIG. 3) wherein a power supply which converts household current to 12 volts DC can be stored, and passes through equally spaced parallel fins 34A of external heat exchanger 34 and passes out of the opposite end of duct 98 in the direction indicated by arrow 37.

It should be noted that fins 34A of external heat exchanger 34 are uniformly spaced along the entire width of duct 98 and extends essentially all the way from the solid base constituting the upper portion of the heat exchanger 34 to the bottom surface 100 of duct 98, whereby essentially all air drawn through inlet opening 101A passes between fins 34A. The air passes from duct 98 out of vent openings 102. The cross sectional area of duct 98 increases with distance from the left hand edge of external heat exchanger 34, reducing resistance of air flow. It has been found that the above-described configuration results in all air drawn through opening 101 being forced through the fins of external heat exchanger 34, resulting in maximum efficiency and cooling external heat exchanger 34, thereby resulting in minimum current drain required to energize fan motor 33 to attain optimum refrigerating efficiency of thermoelectric vessel cooler 1. The inwardly sloping inlet opening surfaces 101 and 101A reduce the likelihood of inadvertent blockage of the air duct inlet and outlet openings, preventing overheating of external heat exchanger 34. The inward slope provided for surface 101 also allows use of a sufficiently large fan blade to attain adequate and efficient air movement through duct 98 with minimum power consumption by fan motor 33.

Referring now to FIGS. 2 and 3, the interior dimensions of cover 3 and the exterior dimensions of vessels 24 and 27 are selected to provide an insulating air gap between the walls of vessels 24 and 27, increasing thermal resistance between the outer side walls of vessels 24 and 27 and the walls of cover 3.

Each of vessels 24 and 27 has a spigot which extends through a lower outer side wall of thermoelectric cooler 1 in the manner shown in FIGS. 1 and 3. More specifically, spigot 16 extends from a point near the base of vessel 24 through the wall of thermoelectric cooler 1, and spigot 15 similarly extends through the wall of thermoelectric cooler 1 from the base of vessel 27. The spigots are located at a height sufficiently above the bottom of base unit 2 to allow dispensing of liquid from containers 24 and 27 into an average sized glass. As best seen in FIGS. 1 and 3, each of the spigots 15 and 16 have a square cross sectioned stem which fits into a corresponding closely fitting square notch in the edge of base unit 2. The flat top of each spigot is precisely flush with the top peripheral edge 23 of base unit 2, so that when the lower peripheral edge 21' of cover 3 is placed in contact with upper edge 23 of base unit 2, the flat lower edge 21' also closely fits against the upper flat surfaces of spigots 15 and 16, thereby preventing leakage of cold air out of the region 96 enclosed by cover 3 and base unit 2. Spigots 15 and 16 each have a valve (indicated by reference numerals 7 and 8). As best seen from FIG. 3, when vessels 24 and 27 are lifted from the respective resting places in cold plate 28, spigots 15 and 16 slide upwardly out of their respective square slots, so that each vessel and its spigot can be conveniently removed for cleaning and/or refilling of that vessel.

If desired, a suitable flexible gasket material can be disposed on either or both of surfaces 23 and 21' to effect tighter sealing of region 96 when vessels 24 and 27 are properly positioned on cold plate 24 and cover 3 is in place on base unit 2. Fluid then can be dispensed from either of the vessels by means of spigots 15 and 16 with no unnecessary heating of the vessels or the interior of compartment 96, which heating would result if cover 3 were removed. This minimizes the power drain used by thermoelectric cooling device 1. This is an important consideration if a battery is utilized as a power source.

Referring to FIGS. 1-3, thermoelectric cooler 1 includes a pair of stirring devices, each of which extends to approximately the bottom of a respective one of vessels 24 and 27, through the lid of that vessel and through one of openings 107 in cover 3 to enable a user to manually stir liquids in vessels 24 and 27 without removing cover 3 from base unit 2.

As shown in FIG. 2, each stirring apparatus includes a vertical rod 109 which extends through a small opening 117' in each of lids 25 and 26. A curved section 113 is attached to the bottom of each of rods 109. Curved section 113 effectively stirs up sediment which may have settled to the bottom of liquids in containers 24 and 27. A rim 117 is affixed to each of rods 109. Rim 117 has a larger outside diameter than opening 117', thereby limiting the downward movement of rod 109. Preferably, rod 109 and curved section 113 are composed of thermally conductive metal in order to improve the uniformity of temperature of liquids stored in vessels 24 and 27. A plastic insulative handle 118 is disposed on the upper end of each of rods 109 in order to enhance gripping of rod 109 by the fingers of a user and also to prevent leakage of outside thermal energy via rod 109 into the liquid. The illustrated stirring apparatus are utilized by moving handles 118 in a direction indicated by arrow 192 in FIG. 3, moving handle 18 back and forth within an elongated slot 107. This causes the lower part of rod 109, including curved section 113, to move in a direction indicated by arrow 130 in FIG. 3, thereby stirring the liquid.

Figure 5:
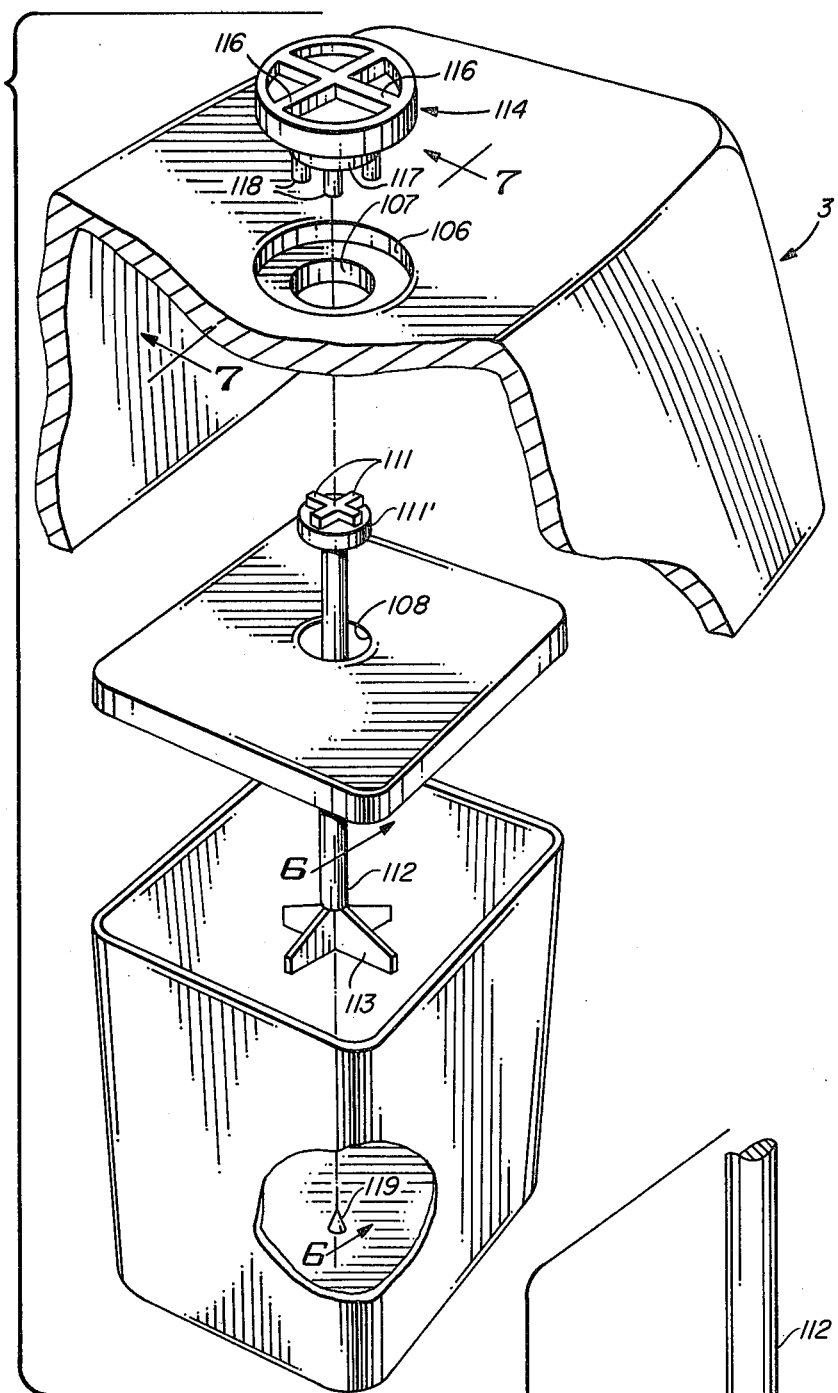
FIG. 5 is a partial cutaway perspective view of an alternate embodiment of the invention.
Figure 7:
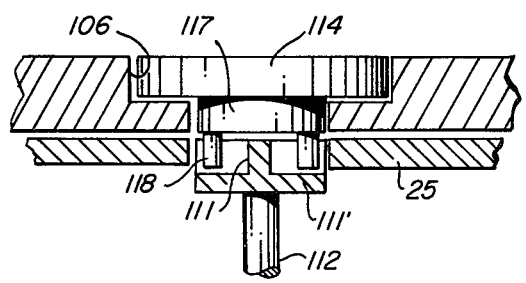
FIG. 7 is a sectional view taken along section line 7—7 of FIG. 5.
Figure 6:
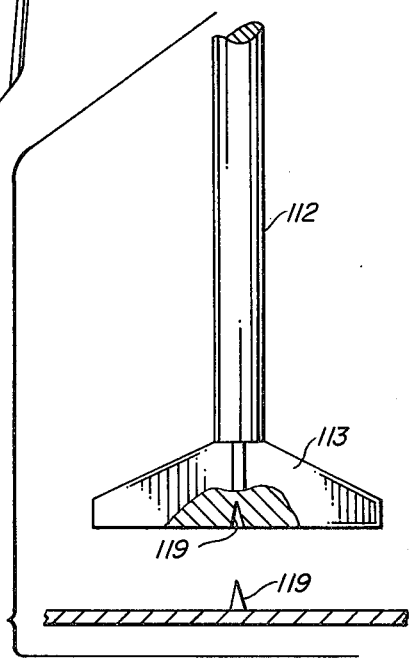
FIG. 6 is a partial sectional view taken along line 6—6 of FIG. 5.

Referring now to FIG. 5, an alternate embodiment of a stirring apparatus is shown wherein the stirring apparatus extends through the top surface of cover 3 and lid 25 of container 24. The stirring apparatus allows a user to stir sediment at the bottom of liquid in container 24 without removing cover 3. The stirring apparatus includes an external turning element 114 and a vertical rod 112. A plurality of vanes 113 are attached to the bottom end of rod 112 and extend radially outward therefrom. At the bottom of container 24, a pin 119 extends upward and is received by a hole 119' in the bottom of rod 112, so that rod 112 rotates about pin 119.

A coupling element 111' is attached to the upper end of rod 109. Coupler 111' includes a disc perpendicular to the axis of rod 109. A cross-shaped element 111 is attached to the upper surface of coupler 111'. The outer surface of disc 111' fits closely within round opening 108 of lid 25, thereby sealing the interior of container 24 while allowing rotation of stirrer 109.

External turning handle 114 fits within a cylindrical recess 106 disposed in the upper surface of cover 3. A round hole 107 extends through the bottom of recess 106. Turning handle 114 fits closely and rotatably within recess 106. A cylindrical bottom plate 117 is centrally attached to the bottom of turning handle 114 and extends through opening 107. Four pins, generally designated by reference numeral 118, extend into the four regions between the adjacent arms of cross-shaped element 111 when container 24 is resting on cold plate 28, lid 25 is properly placed on container 24, the bottom of stirrer 109 rests properly on pin 119, and cover 3 is positioned on base unit 2, as shown in FIGS. 1-3. Thus, when external turning handle 114 is turned, stirrer rod 112 turns, stirring up any sediment which may have settled to the bottom of a beverage or other liquid contained in container 24.

Figure 4:
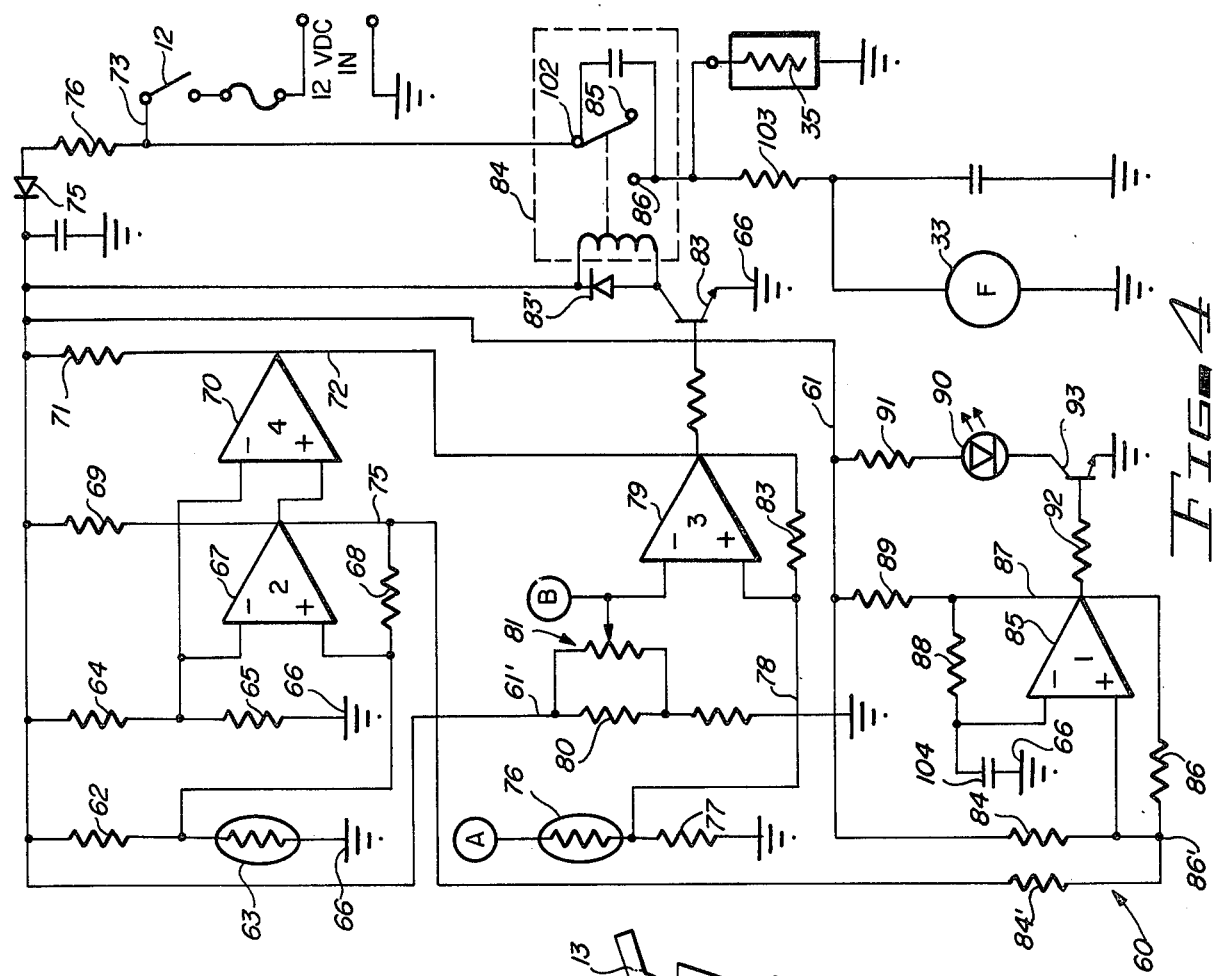
FIG. 4 is a schematic diagram of a control circuit utilized in the thermoelectric jug cooler of FIG. 1.

As shown in FIGS. 1 and 2, a control panel 9 is disposed on the lower side panel of base unit 2. Control panel 9 includes an ON-OFF switch 12, a temperature control 10, and an indicator light. Control 10 is connected to a potentiometer 81, shown in FIG. 4. Indicator light 11 is implemented by a light emitting diode 90 in the circuit of FIG. 4. FIG. 4 is a schematic diagram of the control circuit which controls thermoelectric module 35 and fan motor 33 of thermoelectric cooler 1. The circuitry of FIG. 4 is disposed in enclosure 41 of FIG. 3.

Referring now to FIG. 4, control circuit 60 includes a potentiometer 81 connected to control 10 of FIG. 2. Switch 12 is connected to a 12 volt DC voltage source by means of a fuse. Terminal 73 of switch 12 is connected by means of resistor 76 to the anode of polarity protection diode 75. The cathode of diode 75 is connected to conductor 61. A grounded filter capacitor is also connected to conductor 61. Thermister 63 is attached to external heat exchanger 34 for the purpose of determining whether external heat exchanger 34 becomes overheated due to blockage of air flowing through duct 98 or due to failure of fan motor 33. One terminal of thermister 63 is connected to ground conductor 66. The other terminal of thermister 63 is coupled to conductor 61 by means of resistor 62, to conductor 75 by means of resistor 68, and to the positive input of comparator 67. Resistors 64 and 65 are connected in series between ground conductor 66 and positive voltage conductor 61, forming a resistive voltage divider, the midpoint of which is connected to the negative inputs of both comparators 67 and 70. The output of comparator 67 is connected to conductor 75 and is also connected to the positive input of comparator 70 and is further coupled by means of resistor 69 to positive voltage conductor 61. The output of comparator 70 is connected to conductor 72, which is coupled by means of resistor 71 to positive supply voltage conductor 61.

Thermister 76 is attached to sense the temperature of thermally conductive support 28. Alternately, thermister 76 can be attached to extender block 31'. One electrode of thermister 76 is connected to supply voltage conductor 61. The other terminal of thermister 76 is connected to conductor 78, which is coupled by means of resistor 77 to ground conductor 66 and by means of resistor 83 to conductor 72. Conductor 78 is also connected to the positive input of comparator 79, the output of which is connected to conductor 72. Potentiometer 81 is connected in parallel with resistor 80. One terminal of the parallel connection of resistor 80 and potentiometer 71 is connected to conductor 61' which is coupled by means of resistor 81" to conductor 61. The other terminal of the parallel connection of resistor 80 and potentiometer 81 is coupled by means of resistor 81' to ground conductor 66. The wiper of potentiometer 81 is connected to the negative input of comparator 79. Conductor 72 is coupled by means of resistor 82 to the base of NPN transistor 83, the emitter of which is connected to ground conductor 66.

The collector of transistor 83 is coupled to the coil of relay 84 and to the anode of diode 83'. The opposite terminal of the relay coil of relay 84 is connected to the cathode of diode 83' and to supply voltage conductor 61. Terminal 102 of relay 94 is connected to conductor 73. Terminal 86 of relay 84 is connected to one terminal of thermoelectric module 35, the opposite terminal of which is connected to ground conductor 66. Terminal 86 is also coupled by means of resistor 103 to fan motor 33. Thus, when the wiper of relay 84 contacts terminal 86, both thermoelectric module 35 and fan motor 33 are actuated, causing thermoelectric module 35 to effect transfer of heat from thermally conductive support 29 to external heat exchanger 34.

Conductor 75 is connected to one terminal of resistor 84' the other terminal of which is connected to conductor 86'. Conductor 86' is connected to the positive input of comparator 85, the negative input of which is coupled to ground by means of capacitor 104 and to conductor 87 by means of resistor 88. Conductor 87 is coupled to conductor 61 by means of resistor 89. Conductor 86' is also coupled to conductor 61 by means of resistor 84 and to conductor 87 by means of resistor 86. The output of comparator 85 is connected to conductor 87, which is also coupled to the base of NPN transistor 93 by means of resistor 92. The emitter of transistor 93 is connected to ground conductor 66. The collector of transistor 93 is connected to the cathode of light emitting diode 90, the anode of which is coupled by means of resistor 91 to supply voltage conductor 61.

Comparators 67, 70, 79 and 85 can all be implemented by means of LM 399 N integrated circuit comparators which are readily available.

TABLE I lists the values of the various components of the circuits shown in FIG. 4.

TABLE I

| COMPONENT | RESISTANCE (OHMS) |
| --- | --- |
| 62 | 2,000 |
| 64 | 10,000 |
| 65 | 10,000 |
| 68 | 150,000 |
| 69 | 5,100 |
| 71 | 5,100 |
| 77 | 10,000 |
| 80 | 8,200 |
| 81' | 3,600 |
| 81" | 6,800 |
| 82 | 5,100 |
| 83 | 150,000 |
| 84 | 150,000 |
| 84' | 150,000 |
| 86 | 150,000 |
| 88 | 27,000 |
| 89 | 5,100 |
| 91 | 510 |

In operation, when switch 12 is closed, the 12 volt input voltage, less the forward voltage drop of protection diode 75, is applied to voltage supply conductor 61. If the polarity of the input voltage is inadvertently reversed, protection diode 75 becomes reverse biased, so that no damage occurs to any of the integrated circuit components contained in control circuit 60.

The circuitry associated with comparators 67 and 70 functions as an overheat sensing circuit for the external heat exchanger 34, to which thermister 63 is attached. The circuitry associated with comparator 79 functions as a temperature control circuit to control the temperature of thermally conductive support 28. Circuitry associated with comparator 85 functions to cause light emitting diode 90 to blink in the event of overheating of heat exchanger 34 due to an inoperative fan or blockage of the air flowing through duct 98.

If external heat exchanger 34 (and consequently thermister 63) become overheated, the resistance of thermister 63 falls below the resistance of resistor 62 by an amount sufficient to cause comparator 67 to produce a low output voltage on conductor 75. Consequently, a low output voltage is also produced at the output of comparator 70 on conductor 72.

Normally, a high voltage on conductor 75 causes comparator 85 to produce a high voltage on conductor 87, thereby maintaining transistor 93 in an ON condition, whereby light emitting diode 90 emits a continuous light. When the above-mentioned reduction of the voltage on conductor 75 to a low level occurs as a result of overheating of thermister 63, resistors 83 and 84 function as a voltage divider which establishes a value at the positive input of comparator 85 such that resistor 88, resistor 89, and capacitor 104 cooperate with comparator 85 to produce an oscillating signal having a period of approximately one second on conductor 87. This causes transitor 93 to alternately turn on and off, causing light emitting diode 90 to blink, thereby warning a user of the overheated condition of external heat exchanger 34.

Comparator 79 performs the function of comparing the voltage at the junction between thermister 76 and load resistor 77 with the voltage produced on the wiper of control potentiometer 81. If thermister 76 becomes too cold, its resistance is increased and the voltage on conductor 78 falls. This causes the output of comparator 79 to assume a low state, thereby turning off transistor 83. This causes relay 84 to open, disconnecting both fan motor 33 and thermoelectric module 35 from the 12 volt input voltage. Consequently, thermoelectric module 35 stops transferring heat out of thermally conductive support 28, and the temperature thereof begins to rise and continues rising until thermister 76 becomes sufficiently warm that the voltage on conductor 78 rises above the potential on the wiper of potentiometer 81. At that time comparator 79 again switches, causing the voltage on conductor 72 to assume a high state, thereby turning on transistor 83. The current through transistor 83 actuates relay 84, reconnecting fan motor 33 and thermoelectric module 35 to the positive 12 volt supply voltage. The current through thermoelectric module 35 causes the temperature of cold plate 28 to begin falling again.

The operation of the circuitry associated with comparator 79 as explained above occurs only if external heat exchanger 34 has not exceeded the predetermined temperature established by the voltage divider circuit produced by resistors 64 and 65. If thermister 63 is overheated, the output of comparator 70 is at a low level, as previously explained. The resulting low voltage produced on conductor 72 "overrides" the effort of comparator 79 to raise conductor 72 to a high potential. Consequently, if thermister 63 is overheated, transistor 83 and relay 84 are off regardless of the temperature of cold plate 28.

While the invention has been described with reference to several particular embodiments thereof, those skilled in the art will be able to make various modifications to the structure of the described embodiments without departing from the true spirit and scope of the invention. For example, it is not essential that thermally conductive support 28 and external heat exchanger 34 be located beneath containers 24 and 27. It would be entirely possible to provide a thermoelectric vessel cooler in which the thermoelectric elements and heat exchangers are located beside, rather than beneath, the liquid containing vessel. In this instance, thermally conductive support 28 would be disposed to closely contact the walls of the liquid containing vessel. The spigots extending through the lower wall portion of the vessel would nevertheless extend through an insulated cover to permit dispensing of liquid without removing a cover or insulating material surrounding the vessel, and the stirring mechanism could be provided through the walls of the insulative cover or material surrounding the vessel to effect stirring the liquid without undue leakage of thermal energy into the region in which the vessel is disposed. It is not essential that the opposite ends of duct 98 terminate in air inlet and outlet openings which are disposed on opposite sides of the thermoelectric cooler. It is only necessary that the air inlet and outlet openings be disposed such that heated air exhausted from the outlet opening does not re-enter the duct through the air inlet opening.

We claim:

1. A thermoelectric apparatus for changing the temperature of a quantity of liquid from a first temperature to a second temperature, said thermoelectric apparatus comprising in combination:
   (a) a first container for containing the quantity of liquid, said first container having a top;
   (b) thermally conductive support means for receiving and supporting a bottom of said first container, said thermally conductive support means being shaped to closely contact substantially the entire bottom surface of said first container in order to minimize thermal resistance between said container and said thermally conductive support means;
   (c) base means for supporting said thermally conductive support means, said base means having first and second side walls having first and second holes therein, respectively;
   (d) a removable cover disposed on said base means for cooperating with said base means to bound and thermally insulate a region in which said first container is disposed;
   (e) an elongated duct disposed in said base means, said duct extending from said first opening to said second opening to allow air to pass through said duct and said first and second holes;
   (f) a heat exchanger disposed in said duct, said heat exchanger including a plurality of spaced fins disposed such that substantially all air passing through said duct must pass between various ones of said fins;
   (g) electric fan means disposed in said duct for forcing air to flow through said duct and said first and second holes;
   (h) thermoelectric means for effecting flow of thermal energy between said heat exchanger and said thermally conductive support means to cause the temperature of the liquid to change from the first temperature to the second temperature;
   (i) valve means for controllably conducting fluid through a lower portion of the wall of said container and through a portion of said thermoelectric apparatus adjacent to said lower portion of the wall of said container while said cover means is disposed on said base means;
whereby the fluid can be dispensed from said thermoelectric apparatus without use of a pump due to the action of gravity and without requiring removal of said cover from said base means.

2. The thermoelectric apparatus of claim 1 further including stirring means for stirring the liquid in said container while said cover is disposed on said base means.

3. The thermoelectric apparatus of claim 2 wherein said container has a removable lid having a hole therein, said cover has a first opening in a top surface thereof, said stirring means including an elongated member extending from the removable lid deep into said container and coupling means extending through said first opening for translating movement imparted to said coupling means to said elongated member to effect stirring of the liquid.

4. The thermoelectric apparatus of claim 3 wherein:
   (a) said first opening is elongated;
   (b) said coupling means includes an upper portion of said elongated member, said upper portion extending through said first opening approximately to the upper surface of said cover;
   (c) mixing means attached to the bottom of said elongated member for mixing the fluid near the bottom of said container;
said elongated member pivoting about said hole in said removable lid so that lateral displacement of said upper portion causes corresponding lateral displacement of said mixing means.

5. The thermoelectric apparatus of claim 1 wherein:

(a) said valve means includes a tube attached to said portion of the wall of said container, said tube having an upper surface and a lower surface;

(b) said base means has a peripheral upper edge surface which contacts the lower surface of said tube when said container rests on said thermally conductive support means in order to minimize leakage of thermal energy along said tube into or out of said region;

(c) said cover has a peripheral lower edge surface which contacts the upper surface of said tube when said cover is disposed on said base means in order to minimize leakage of thermal energy along said tube into or out of said tube.

6. The thermoelectric apparatus of claim 1 wherein said second temperature is lower than said first temperature.

7. The thermoelectric apparatus of claim 3 wherein said elongated member is composed of material which is highly thermally conductive in order to increase the uniformity of the temperature of the liquid.

8. The thermoelectric apparatus of claim 1 further including a second container supported by said thermally conductive support means.

9. The thermoelectric apparatus of claim 8 wherein said first and second container each have substantially rectangular horizontal cross sections.

10. The thermoelectric apparatus of claim 8 wherein said thermally conductive support means includes a thermally conductive member extending upward between adjacent side surfaces of said first and second containers contacting upper portions of said adjacent side surface in order to cause liquid adjacent to the upper portions of said first and second containers to attain the second temperature, thereby producing convection currents in the liquid in said first and second containers, increasing the uniformity of the temperature of the liquid in each of said first and second containers.

11. The thermoelectric apparatus of claim 1 wherein said first and second walls are on opposed sides of said thermoelectric apparatus.

12. The thermoelectric apparatus of claim 11 wherein lower portions of each of said first and second walls are inclined inwardly toward each other, and wherein said first and second holes are disposed in said lower portions, said elongated duct narrowing from said first and second holes to a midsection portion wherein said heat is disposed.

13. The thermoelectric apparatus of claim 12 wherein said electric fan means includes a fan element disposed adjacent to said first hole at least a portion of the periphery of said first hole being approximately coextensive with a circular path traced by ends of a blade of said fan means.

14. The thermoelectric apparatus of claim 13 wherein said electric fan means includes a drive shaft which is substantially perpendicular to said lower portion of said first wall.

15. A thermoelectric apparatus for changing the temperature of a quantity of liquid from a first temperature to a second temperature, said thermoelectric apparatus comprising in combination:

(a) a first container for containing the quantity of liquid, said first container having a top, said first container having a major surface area;

(b) thermally conductive means for thermally contacting said first container, said thermally conductive means being shaped to minimize thermal resistance between said container and said thermally conductive means;

(c) support means for supporting said thermally conductive means, said support means having first and second walls having first and second holes therein, respectively;

(d) a removable cover disposed on said base means for cooperating with said support means to bound and thermally insulate a region in which said first container is disposed;

(e) an elongated duct disposed in said support means, said duct extending from said first opening to said second opening to allow air to pass through said duct and said first and second holes;

(f) a heat exchanger disposed in said duct, said heat exchanger including a plurality of spaced fins disposed such that substantially all air passing through said duct must pass between various ones of said fins;

(g) electric fan means disposed in said duct for forcing air to flow through said duct and said first and second holes; and (h) thermoelectric means for effecting flow of thermal energy between said heat exchanger and said thermally conductive support means to cause the temperature of the liquid to change from the first temperature to the second temperature.

* * * * *